United States Patent [19]

Shibata

[11] Patent Number: 5,150,797
[45] Date of Patent: Sep. 29, 1992

[54] IC SORTING AND RECEIVING APPARATUS AND METHOD

[75] Inventor: Junichirou Shibata, Urawa, Japan

[73] Assignees: Tokyo Electron Limited, Tokyo; Tokyo Electron Yamanashi Limited, Nirasaki, both of Japan

[21] Appl. No.: 725,518

[22] Filed: Jul. 3, 1991

[30] Foreign Application Priority Data

Jul. 18, 1990 [JP] Japan ................................. 2-190122

[51] Int. Cl.⁵ .............................................. B07C 5/344
[52] U.S. Cl. .................................. 209/573; 414/404; 414/416; 324/158 F
[58] Field of Search ............... 209/571, 573, 905, 936; 414/225, 404, 416; 324/158 F

[56] References Cited

U.S. PATENT DOCUMENTS

| | | | |
|---|---|---|---|
| 3,308,977 | 3/1967 | Cochran | 414/404 |
| 3,720,309 | 3/1973 | Weir | 209/573 |
| 4,708,582 | 11/1987 | Hamada et al. | 414/416 |
| 4,715,501 | 12/1987 | Sato et al. | 209/571 |
| 4,907,701 | 3/1990 | Kobayashi et al. | 209/905 |
| 4,936,329 | 6/1990 | Michael et al. | 414/416 |
| 4,997,552 | 3/1991 | Schlinkmann et al. | 209/573 |
| 5,073,079 | 12/1991 | Akagawa | 414/416 |

Primary Examiner—Joseph E. Valenza
Attorney, Agent, or Firm—Oblon, Spivak, McClelland, Maier & Neustadt

[57] ABSTRACT

An IC sorting and receiving apparatus has a transportation unit for transporting ICs sorted in accordance with tested results, and a reception unit for receiving the ICs transported by the transportation unit. The reception unit includes at least one vertically movable tray loader having a vertical drive unit, and a horizontally movable tray loader provided over the vertically movable tray loader. The horizontally movable tray loader has a horizontal drive unit for moving the horizontally movable tray loader horizontally away from the region over the vertically movable loader.

22 Claims, 4 Drawing Sheets

IC SORTING AND RECEIVING APPARATUS AND METHOD

BACKGROUND OF THE INVENTION

1. Field of the Invention

This invention relates to a test apparatus for semiconductor integrated circuits (hereinafter referred to as the "ICs"), and more particularly to an apparatus for automatically testing ICs mounted on a tray, sorting the ICs after test and collecting the same in other trays.

2. Description of the Related Art

An IC handler is frequently used as a test apparatus to automatically supply ICs which are assembled and received in cases to a test section, check whether the respective ICs are acceptable, and sort them. The IC handlers are of a tray type or of a stick type when they are classed according to how to supply ICs. The stick type IC handler has a stick constituting an elongated supporter which holds a row of ICs. The ICs are supplied one by one to a test section by their own weight by inclining the stick, on one hand, and by means of an intermittent delivery mechanism, on the other hand. The tested ICs are sorted into accepted ICs, unaccepted ICs and ICs to be tested again, for example, and received by sorted trays. The tray type IC handler has a robot arm provided with a pickup unit for picking up ICs loaded on a plate-like tray. The ICs are, one by one, transported to the test section by means of the robot arm, and, after test they are loaded on the sorted IC trays by means of the robot arm in the same manner a in the stick type IC handler.

With the stick type IC handler, the leads of each IC are moved up and down by contacting with the inner wall of the stick, causing the leads to be deformed and thus to be jammed. This results in the generation of erroneous signals in the test section and the clogging of ICs in a transport passage while being transported. With the tray type IC handler, the leads of ICs are less jammed than with the stick type tray handler, but a wide space for admitting sorted IC trays is required, rendering the floor space of the handler large.

SUMMARY OF THE INVENTION

The object of this invention provides an IC test apparatus in which sorted IC trays are arranged in a three-dimensional state to render minimized the installation area of the IC testing apparatus in a clean room for manufacturing ICs.

In one aspect of this invention which attains the above-mentioned object, an IC testing apparatus comprises transportation means for transporting ICs sorted according to test results, and reception means for receiving the ICs transported by means of the transportation means, the reception means provided with at least one vertically movable tray loader having vertical drive means and a horizontally movable tray loader disposed above the vertically movable tray loader and having horizontal drive means for horizontally moving the horizontally movable loader away from the region over the vertically movable loader upon transporting the ICs to vertically movable tray loader.

In another aspect of this invention an IC sorting and receiving apparatus comprises a tray loader on which a plurality of trays are loaded. The tray loader comprises a vertically movable tray loader and a horizontally movable tray loader capable of being disposed over the vertically movable tray loader. When the tested ICs are loaded on the trays on the vertically movable tray loader, the horizontally movable tray loader is moved away from the region over which the vertically movable tray loader is disposed. The three-dimensional arrangement of the tray loader for receiving the tested, sorted ICs reduces the space required for the IC sorting and receiving apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of this invention will now be explained with reference to the accompanying drawings.

Figure 1:
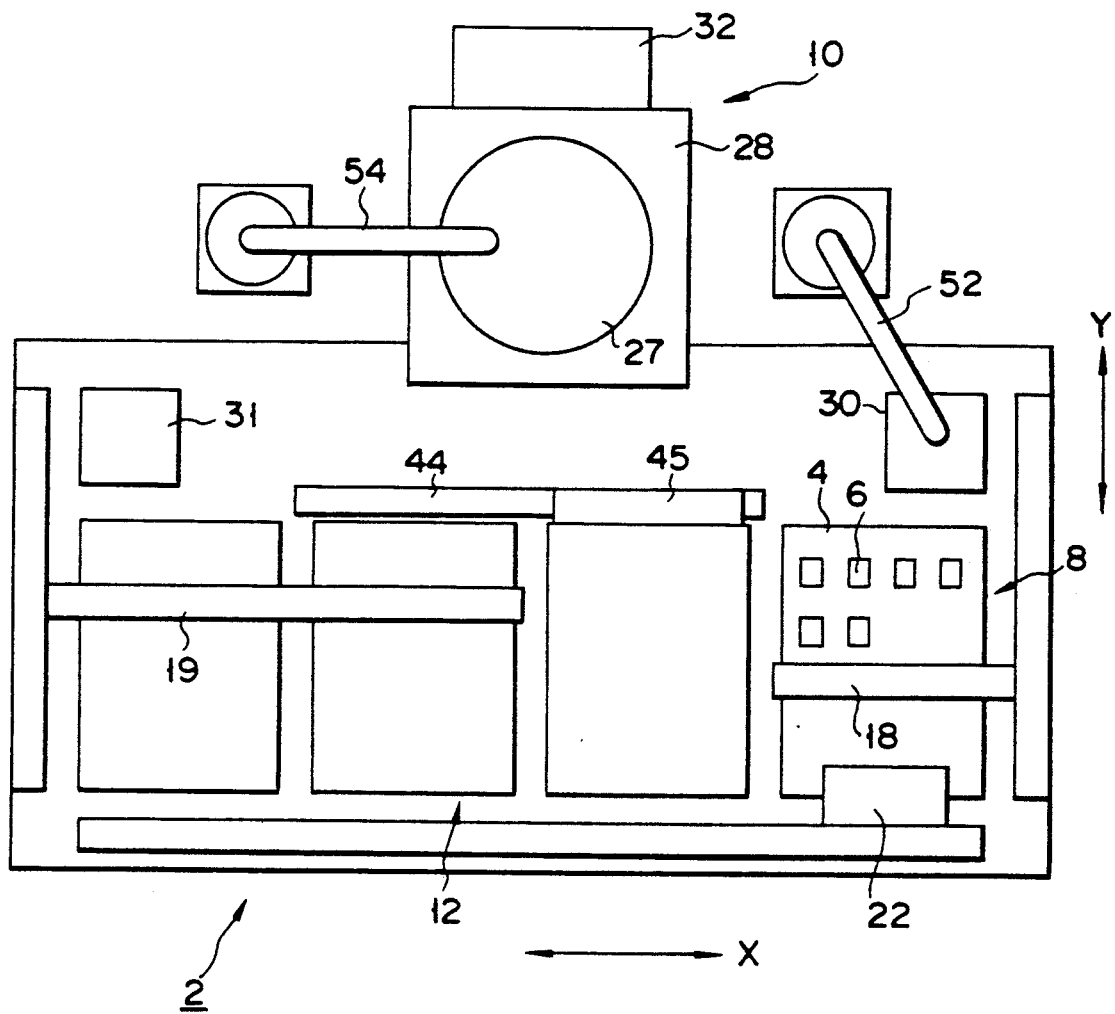
FIG. 1 is a plan view of an IC inspecting apparatus according to one embodiment of this invention.

As shown in FIG. 1, an IC handler 2 according to one embodiment of this invention comprises a loader section 8 for loading ICs 6 to be tested on a to-be-tested IC tray 4, a test section 10 for testing the ICs 6 transported from the loader section 8 and a reception section 12 for receiving the tested ICs 6 unloaded from the test section 10.

Figure 2:
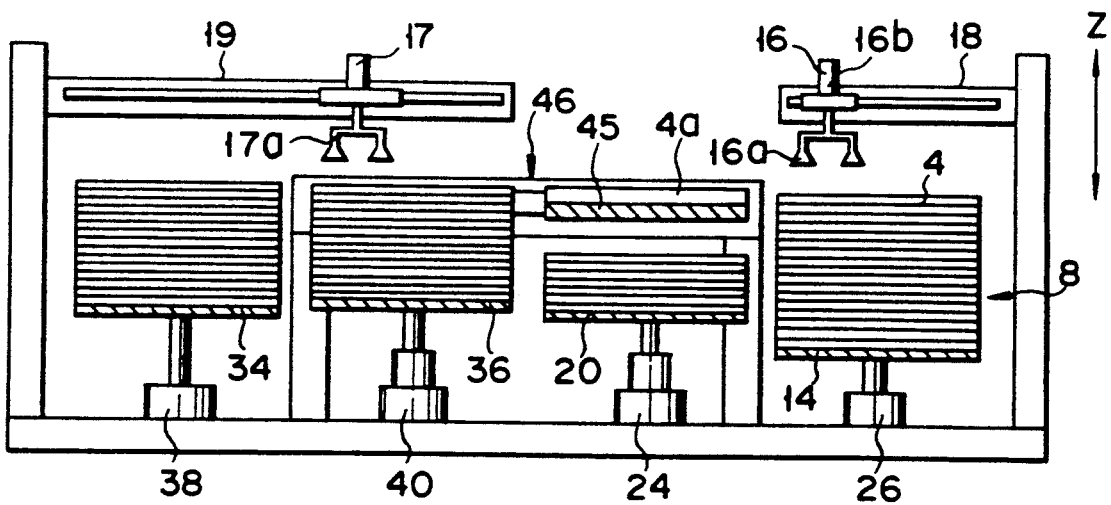
FIG. 2 is a front view of the IC inspecting apparatus shown in FIG. 1.

In FIG. 2, the loader section 8 is provided with a vertically movable, to-be-tested IC tray loader 14 on which trays 4 holding ICs 6 to be tested are loaded on one after another. For example, the ICs are flat package types, each has electrode leads protruded in a line from the side surfaces. Above loader 14 is provided a first robot arm 18 which includes a sucking arm such as a pickup unit 16 having a pair of suction elements 16a and movable in rightward and leftward and back and forth directions (hereinafter referred to as the "X-Y" directions) by means of a motor such as a pulse motor (not shown). The pickup unit 16 has an air cylinder 16b for moving the suction elements 16a upward and downward (that is, in Z directions). Upon picking up ICs 6 on the tray 4, the pickup unit 16 of the first robot arm 18 is moved in required one of the X-Y directions so as to locate the suction elements 16a over the ICs 6 to be picked up, and allows the suction elements 16a to be lowered to hold the ICs 6. After the suction elements 16a have sucked and held the ICs 6, the ICs 6 are lifted by means of the pickup unit 16 due to the actuation of the air cylinder 16b and transported to an alignment stage 30 for aligning ICs 6 with each other according to the movement of the robot arm 18 in said one of the X-Y directions by means of the pickup unit 16.

An empty tray loader 20 is provided adjacent to the loader section 8 in the reception section 12, and a third robot arm 22 is provided in parallel with the loader section 8 and the reception section 12 so as to move crosswise (that is, in X directions). After all ICs 6 loaded on the highest to-be-tested IC trays 4 on the loader 14 have been transported to the test section 10 via the alignment stage 30 and the trays 4 have become empty, the empty trays 4 are carried from the loader 14 to the empty tray loader 20 by means of a pickup unit (not shown) of the third robot arm 22.

The vertically movable loader 14 is provided on a vertical drive mechanism 26 and moved vertically by means of a pulse motor. The empty tray loader 20 is provided on a vertical drive mechanism 24 which has an air cylinder 24b (FIG. 5A) for performing predetermined vertical strokes and a pulse motor 24a (FIG. 5A) for making fine adjustment of the strokes of the empty tray loader 20. After the third robot arm 22 has moved the empty trays 4 to the empty tray loader 20, the vertically movable loader 14 is lifted by the height of a tray 4 and, on the contrary, the empty tray loader 20 is lowered by the same amount. Thereafter, ICs 6 on each new highest tray 4 on the loader 14 are transported to the alignment stage 30, one by one, by means of the first robot arm 18.

The ICs 4 transported to the alignment stage 30 are aligned with each other thereon and picked up by means of a fourth robot arm 52 to be transported to the test section 10.

The ICs, now mounted in the test section 10, are subjected fine alignment. Then, the leads of the flat package of each IC are electrically connected to probe terminals. More specifically, the probe device having a row of probe terminals is gradually until the terminals come into contact with the leads of the flat package.

The test section 10 includes a socket type tester (testing apparatus) 28 for testing electrical characteristics of the ICs 4. The tester 28 further comprises an XYZ stage 27 and a controller 32 having a CPU and a memory. The tester 28 determines whether each IC is good (accepted), not good (unaccepted) or to be retested and memorizes the tested results in the memory in the controller 32. After the test, the ICs are unloaded from the tester 28 and transferred to a reverse stage 31 which turns the ICs through 180° by means of a motor (not shown).

The turned ICs are picked up by a second robot arm 19 having suction elements 17a and a pickup unit 17 having similar structures to those of the first robot arm 18, and brought to an accepted IC tray or an unaccepted IC tray in accordance with the data stored in the memory in the controller 32, when the respective tested ICs are good (accepted) or no good (unaccepted). The reception of the tested IC which is determined to be retested will be explained later.

The reception section 12 is provided with an accepted IC tray loader 34 having the accepted IC trays mounted thereon and an unaccepted IC tray loader 36 having the unaccepted IC tray mounted thereon. The accepted IC tray loader 34 is provided with a vertical drive mechanism 38 moved vertically by means of a pulse motor, and the unaccepted IC tray loader 36 is provided with a vertical drive mechanism 40 which performs predetermined strokes and makes fine adjustment of the tray loader 36 by means of a pulse motor 40b and an air cylinder 40a (both shown in FIG. 5A), respectively.

After all trays on either the accepted IC tray loader 34 or the unaccepted IC tray loader 36 have been filled with the tested ICs 6, the loaders 34 or 36 is lowered by the height of a tray by means of the vertical drive mechanism 38 or 40, and empty trays on the empty tray loader 20 are, in turn, transported to the accepted IC tray loader 34 or the unaccepted IC tray loader 36 by means of the third robot arm 22.

Figure 3:
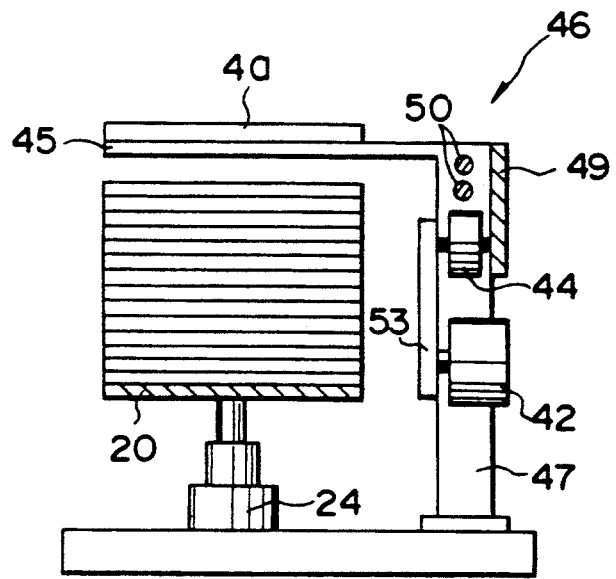
FIG. 3 is a partially broken side view of a horizontal drive un t of the embodiment of this invention.
Figure 4:
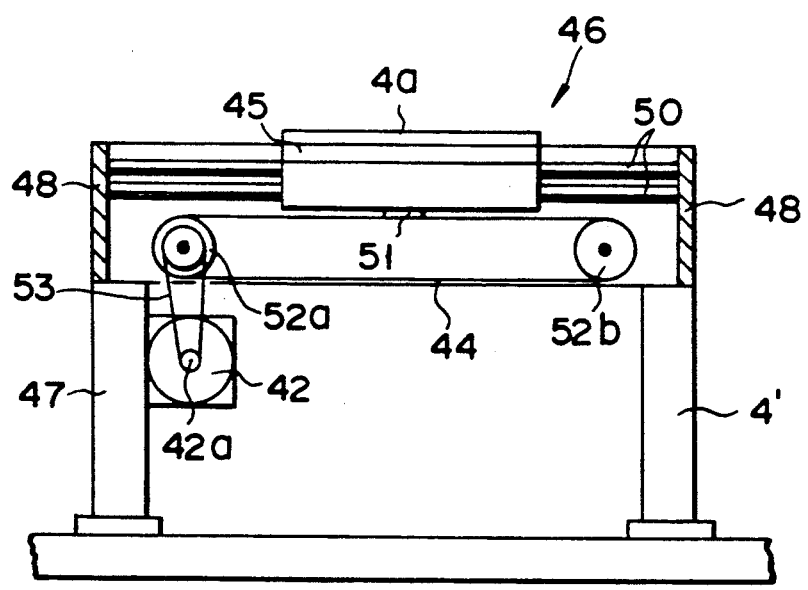
FIG. 4 is a partially broken front view of the horizontal drive unit.

Referring to FIGS. 3 and 4, a horizontal drive unit 46 having a horizontal belt 44 driven by a motor 42 is provided in a region over the unaccepted IC tray loader 36 and the empty tray loader 20. The horizontal drive unit 46 includes a pair of legs 47, a pair of side walls 48, a rear wall 49, and a pair of parallel guide rails 50 extending between the side walls 48. A retest tray loader or slider 45 is mounted on the horizontal belt 44 by means of a connecting portion 51 so as to slide along the guide rails 50.

The horizontal belt 44 is wound on a pair of pulleys 52a and 52b rotatably mounted on the both side portions of the rear wall 49, one of the pulleys 52a being connected to the rotary shaft 42a of the motor 42 by means of a drive belt 53.

The operation of the IC handler according to this embodiment will now be explained.

A plurality of trays 4 accommodating ICs 6 to be tested are loaded on the tray loader 14 of the loader section 8 by means of a transportation robot or by an operator.

Next, the ICs 6 to be tested are transported from the tray loader 14 to the alignment stage 30 by means of the first robot arm 18 in response to the programs which are memorized previously. After the alignment, the ICs 6 are moved by means of the fourth robot arm 52 to the XYZ stage 27 of the electric-characteristic tester 28.

On the XYZ stage, the ICs are aligned more minutely, thereby accomplishing fine alignment. Then, the probe device is lowered until the probe terminals come into electrical contact with the leads of each IC.

The electrical characteristics of the ICs 6 are then checked by the tester 28, and the tested results are memorized in the memory in the controller 32. The tested ICs are sent to the reverse stage 31 by means of a fifth robot arm 54 and turned reversely on the stage 31.

Among the turned ICs, the ICs which have been determined to be accepted by the tester 28 are picked up and transported to the trays on the accepted IC tray loader 34 by means of the second robot arm 19 which is operated in accordance with the test result "ACCEPTED".

Under the condition where the retest tray loader 45 is located over the empty tray loader 20 as shown in FIG. 2, the ICs 6 which have been determined to be unaccepted are transported onto the trays on the unaccepted IC tray loader 36 by means of the second robot arm 19 which is operated in accordance with the test result "UNACCEPTED".

Figure 5A:
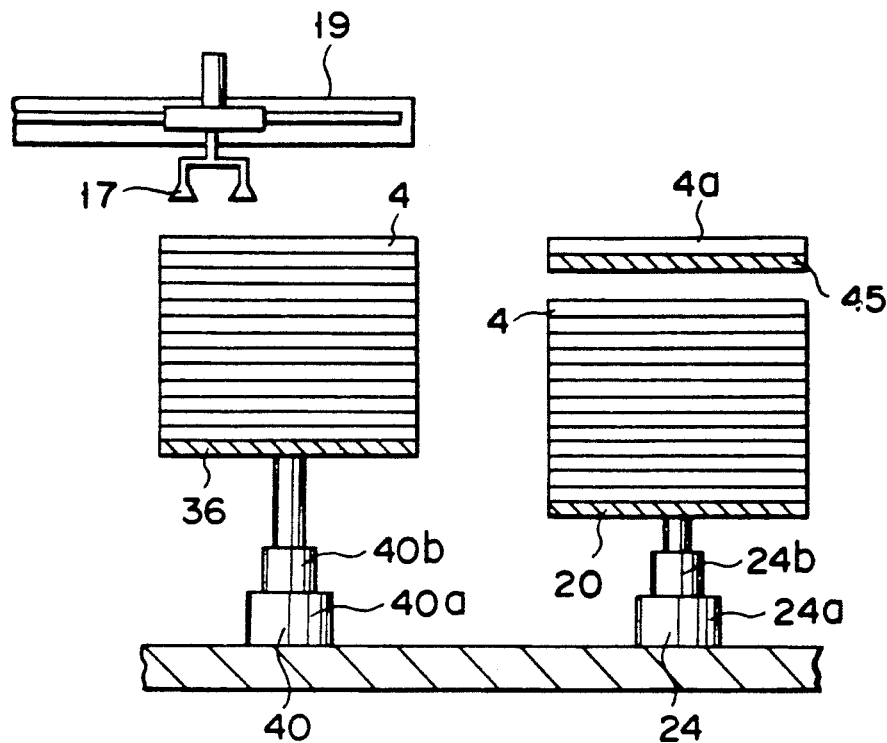
FIGS. 5A to 5D show the process how an empty tray loader, an unaccepted tray loader and a retest tray are operated.
Figure 5B:
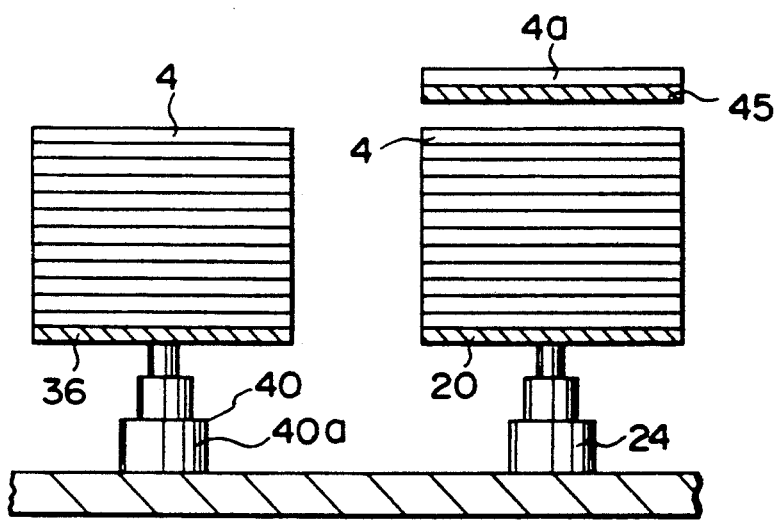
Figure 5C:
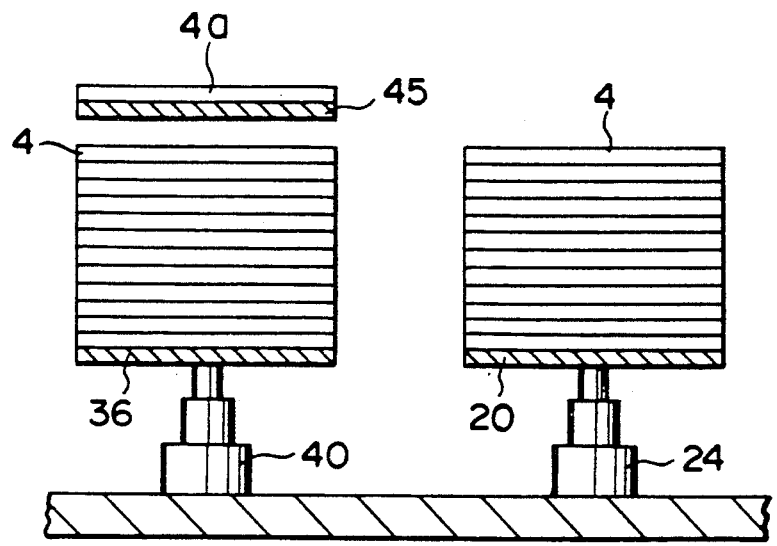
Figure 5D:
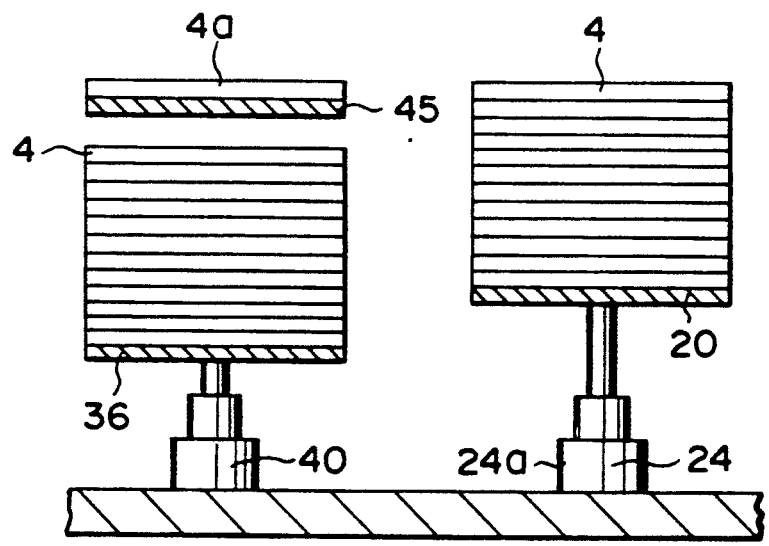

The ICs 6 which have been judged by the tester 28 as being to be retested are handled in the process as shown in FIGS. 5A to 5D. When a signal which indicates that ICs 6 are to be retested in a state as shown in FIGS. 2 and 5A is output from the tester 28 of the test section 10, the unaccepted tray loader 36 is lowered by a predetermined stroke by means of the air cylinder 40a of the vertical drive mechanism 40, as shown in FIG. 5B. Then, as shown in FIG. 5C, the retest tray loader 45 is moved to a region over the unaccepted IC tray loader 36 by moving the horizontal belt 44 by means of the motor 42 of the horizontal drive unit 46, and thereafter the empty tray loader 20 is lifted by the predetermined stroke by means of the vertical drive mechanism 24 under the condition where the retest tray loader 45 takes a waiting position as shown in FIG. 5D.

The present position of the retest tray loader 45 moved by the horizontal drive unit 46 is memorized in the memory in the controller 32. When a group of ICs are determined as being to be retested, the retest tray loader 45 is moved to be located over the unaccepted IC tray loader 36 and the ICs to be retested are received by the retest tray 4a.

After all ICs 6 on all the highest trays on the loader 14 of the loader section 8 have been transferred from the loader 14 to the loader 30 and then checked by the tester 28, the trays which have become empty on the loader 14 are transferred onto the empty tray loader 20 by means of the third robot arm 22.

Where the highest trays on the accepted IC tray loader 34 have been filled with accepted ICs, the loader 34 is lowered by the height of a tray and the trays which have become empty on the empty tray loader 20 are moved onto the accepted IC tray loader 34 by means of the third robot arm 22.

In case in which the highest trays on the unaccepted IC tray loader 34 have been filled with unaccepted ICs, the third robot arm 22 picks up the empty tray from the empty tray loader 20 and takes a waiting position at which the arm 22 picks up the empty trays. While the arm 22 is at the waiting position, the retest tray loader 45 is moved to a region over the empty tray loader 20 by means of the horizontal drive unit 46, and then the retest tray loader 45 is moved onto the region over the empty tray loader 20 by means of the horizontal drive unit 46 so that the space over the unaccepted IC tray loader 36 is rendered opened. Thereafter, the empty trays which are being held by the third robot arm 22 are moved onto the unaccepted IC tray loader 36.

When the trays on the retest tray loader 45 have been filled with ICs to be retested, the retest tray loader 45 is located over the unaccepted IC tray loader 36, and then empty trays can be moved from the empty tray loader 20 to the retest tray loader 45.

Instead of providing the retest tray loader 45 on the horizontal drive unit 46 as in this embodiment, it is also preferable to provide on the horizontal drive unit a tray loader which holds trays for receiving ICs whose sorted number is smaller than the number of sorted ICs on the other tray loaders.

As described above, this invention has a structure in which trays on which sorted ICs whose number is the smallest among the sorted groups of trays are loaded are mounted on a tray loader provided on the horizontal drive unit so that the tray loaders are arranged in a three-dimensional state. This structure facilitates effective use of the space over the apparatus and reduces the floor space of the clean room for manufacturing semiconductors.

The IC sorting and receiving apparatus according to this invention is not limited to an IC handler but is applicable to any kind of a tray type IC inspector. The horizontal drive unit is not limited to a belt driving type but may be a drive mechanism comprising a ball screw and a nut. When a great number of ICs are to be sorted, two or more tray loaders traveling horizontally can be utilized. Three or more tray loaders are arranged in a multistory fashion.

Needless to say, this invention is not limited to the above-mentioned embodiments but various modification are available within the scope of this invention.

What is claimed is:

1. An IC sorting and receiving apparatus comprising:
   transportation means for transporting ICs to be sorted and received according to tested results; and
   reception means for receiving said ICs transported by means of said transportation means and keeping them in groups according to the tested results, said reception means comprising a vertically movable tray loader having vertical drive means, and a horizontally movable tray loader having horizontal drive means which can be moved in a horizontal direction away from a region over said vertically movable tray loader when said ICs are transported onto said vertically movable tray loader.

2. The apparatus according to claim 1, wherein said transportation means has a robot arm moving in a horizontal plane and a pickup unit moving in vertical directions.

3. The apparatus according to claim 1, wherein said horizontal drive means has a pair of pulleys and a belt wound on said pulleys and a motor for driving said belt.

4. The apparatus according to claim 3, wherein said horizontal drive means has a guide rail, and a slider slidably mounted on said guide rail and provided on said belt.

5. The apparatus according to claim 1, wherein said vertical drive means has an air cylinder for moving said vertically movable tray loader vertically by a predetermined stroke and a pulse motor for finely adjusting said stroke of said vertically movable tray loader.

6. The apparatus according to claim 1, wherein said reception means has three vertically movable tray loaders.

7. The apparatus according to claim 6, wherein said horizontally movable tray loader is provided with horizontal drive means disposed in a region over two adjacent ones of said three vertically movable tray loaders, said horizontally movable tray loader being adapted to be movable horizontally in said region from one of said two vertically movable tray loaders to a position over the other one of said two horizontally movable tray loaders, when each of said ICs is transported onto said one of said two horizontally movable tray loaders.

8. The apparatus according to claim 1, wherein said transportation means and said reception means are formed to transport and receive ICs of the flat package types.

9. An IC sorting apparatus and receiving apparatus comprising:
   transportation means for transporting ICs to be sorted and received according to tested results; and
   reception means for receiving said ICs transported by means of said transportation means and keeping them in groups according to the tested results, said reception means comprising three vertically movable tray loaders each having vertical drive means, and a horizontally movable tray loader disposed in a region over adjacent two ones of said three vertically movable tray loaders, said horizontally movable tray loader being adapted to be movable horizontally in said region from one of said two vertically movable tray loaders to a position over the other one of said two horizontally movable tray loaders, when said ICs are transported onto said one of said two horizontally movable tray loaders.

10. The apparatus according to claim 9, wherein said transportation means has a robot arm movable in a horizontal plane and a pickup unit movable in vertical directions.

11. The apparatus according to claim 9, wherein said horizontal drive means has a pair of pulleys and a belt wound on said pulleys and a motor for driving said belt.

12. The apparatus according to claim 11, wherein said horizontal drive means has a guide rail, and a slider slidably mounted on said guide rail and provided on said belt.

13. The apparatus according to claim 9, wherein said vertical drive means has an air cylinder for moving said vertically movable tray loader vertically by a predetermined stroke, and a pulse motor for finely adjusting said stroke of said vertically movable tray loader.

14. An IC testing apparatus comprising:
test means for testing ICs;
a first tray loader for loading said ICs to be delivered to said test means;
transportation means for transporting said ICs to be sorted according to tested results obtained from said test means;
at least one second tray loader having vertical drive means and movable vertically; and
a third tray loader provided in a region over said second tray loader and having horizontal drive means for moving said third tray loader horizontally away from a region over said second tray loader when said ICs are transported to said second tray loader.

15. The apparatus according to claim 14, wherein said second tray loaders are three in number and arranged adjacent to one after another, and said third loader tray loader is provided in a region over two adjacent ones of said three second tray loaders, and wherein there is further provided horizontal drive means for moving said third tray loader horizontally from one of said two second tray loaders to the other one of said two second tray loaders when said ICs ar transported onto said one of said two second loaders.

16. The apparatus according to claim 14, wherein said transportation means has a robot arm moving in a horizontal plane and a pickup unit moving in vertical directions.

17. The apparatus according to claim 14, wherein said horizontal drive means has a pair of pulleys and a belt wound on said pulleys and a motor for driving said belt.

18. The apparatus according to claim 17, wherein said horizontal drive means has a guide rail, and a slider slidably mounted on said guide rail and provided on said belt.

19. The apparatus according to claim 14, wherein said vertical drive means has an air cylinder for moving said vertically movable tray loader vertically by a predetermined stroke, and a pulse motor for finely adjusting said stroke of said vertically movable tray loader.

20. A method of sorting ICs in accordance with at least two categories and receiving ICs comprising the steps of:
transporting, by means of a transportation unit, ICs to be sorted in accordance with tested results defined by a first category and a second category;
transporting said ICs sorted in accordance with said first category onto trays on a first tray loader movable in vertical directions;
moving a second tray loader to a region over said first tray loader so that trays mounted on said second tray loader receive said ICs sorted in accordance with said second category; and
moving said second tray loader away from said region over said first tray loader when said trays on said first tray loader receives said ICs sorted in accordance with said first category.

21. The method according to claim 20, wherein the step of receiving said ICs sorted in accordance with said second category comprises the sub-steps of:
locating said second tray loader over a third tray loader having empty trays mounted thereon in advance;
lowering said first loader by a predetermined stroke;
moving said second tray loader in said region over said first tray loader; and
lifting said third tray loader by said stroke.

22. The method according to claim 21, further comprising the step of transporting empty trays from said third tray loader onto said first tray loader every time and trays on said first tray loader are filled with said ICs.

* * * * *